(12) United States Patent
Doi et al.

(10) Patent No.: US 11,656,102 B2
(45) Date of Patent: May 23, 2023

(54) PROXIMITY SENSOR UNIT AND DISTANCE CALCULATION DEVICE

(71) Applicant: OMRON Corporation, Kyoto (JP)

(72) Inventors: Sayaka Doi, Joyo (JP); Hiroki Koga, Nara (JP); Naoki Yoshitake, Kusatsu (JP)

(73) Assignee: OMRON CORPORATION, Kyoto (JP)

( * ) Notice: Subject to any disclaimer, the term of this patent is extended or adjusted under 35 U.S.C. 154(b) by 52 days.

(21) Appl. No.: 17/274,651

(22) PCT Filed: Mar. 11, 2019

(86) PCT No.: PCT/JP2019/009644
§ 371 (c)(1),
(2) Date: Mar. 9, 2021

(87) PCT Pub. No.: WO2020/100320
PCT Pub. Date: May 22, 2020

(65) Prior Publication Data
US 2021/0310833 A1      Oct. 7, 2021

(30) Foreign Application Priority Data
Nov. 15, 2018   (JP) .............................. JP2018-214462

(51) Int. Cl.
*G01R 27/26* (2006.01)
*G01D 5/24* (2006.01)

(52) U.S. Cl.
CPC ...................................... *G01D 5/24* (2013.01)

(58) Field of Classification Search
USPC .................... 324/658, 660–663, 679, 671
See application file for complete search history.

(56) References Cited

U.S. PATENT DOCUMENTS

| 4,568,873 | A | * | 2/1986 | Oyanagi | ................ | G01B 7/023 |
| | | | | | | 340/870.37 |
| 6,118,532 | A | * | 9/2000 | Peters | ..................... | G01J 3/457 |
| | | | | | | 356/338 |
| 10,128,840 | B2 | | 11/2018 | Zhang et al. | | |
| 2010/0097015 | A1 | * | 4/2010 | Knoedgen | ............ | G01D 5/2417 |
| | | | | | | 318/135 |

(Continued)

FOREIGN PATENT DOCUMENTS

| JP | S5435374 U | 3/1979 |
| JP | H02114109 A | 4/1990 |
| JP | H0395187 U | 9/1991 |

(Continued)

OTHER PUBLICATIONS

International Search Report for International Application No. PCT/JP2019/009644, dated May 21, 2019.

(Continued)

*Primary Examiner* — Vincent Q Nguyen
(74) *Attorney, Agent, or Firm* — Cantor Colburn LLP (57) ABSTRACT

A proximity sensor unit includes a proximity sensor section including a sensor electrode capable of detecting a capacitance value according to a distance to an object to be detected in a detection direction and a moving device capable of moving the sensor electrode of the proximity sensor section or the object to be detected in the detection direction.

10 Claims, 5 Drawing Sheets

(56) References Cited

U.S. PATENT DOCUMENTS

2017/0363407 A1  12/2017  Sugita et al.
2019/0265072 A1  8/2019  Wada et al.

FOREIGN PATENT DOCUMENTS

| JP | H05296710 A | 11/1993 |
| JP | 2001004431 A | 1/2001 |
| JP | 2002140771 A | 5/2002 |
| JP | 3684687 B2 | 8/2005 |
| JP | 2008046080 A | 2/2008 |
| JP | 2013003639 A | 1/2013 |
| JP | 2017228754 A | 12/2017 |
| JP | 2002098504 A | 4/2022 |
| WO | 2018088144 A1 | 5/2018 |

OTHER PUBLICATIONS

PCT Written Opinion of the International Searching Authority for International Application No. PCT/JP2019/009644 dated May 21, 2019.
EPO Extended European Search Report for corresponding EP Application No. 19884239.5; dated Apr. 4, 2022.
JPO Decision of Dismissal of Amendment corresponding to JP Application No. 2018-214462; dated Sep. 27, 2022.

\* cited by examiner

PROXIMITY SENSOR UNIT AND DISTANCE CALCULATION DEVICE

CROSS REFERENCE TO RELATED APPLICATIONS

This is the U.S. national stage of application No. PCT/JP2019/009644, filed on Mar. 11, 2019. Priority under 35 U.S.C. § 119(a) and 35 U.S.C. § 365(b) is claimed from Japanese Application No. 2018-214462, filed Nov. 15, 2018, the disclosure of which is also incorporated herein by reference.

TECHNICAL FIELD

The present disclosure relates to a proximity sensor unit and a distance calculation device including the proximity sensor unit.

BACKGROUND ART

Patent Document 1 discloses a capacitive displacement sensor that finely oscillates, in a low cycle, a capacitive sensor that detects a change in the distance between a displacement measurement target face and a measurement face of a capacitive electrode as a change in capacitance. This capacitive displacement sensor is configured so that an amplitude of the change in capacitance due to small oscillation is detected as a voltage value, and this voltage value is converted into a distance to obtain a displacement of the displacement measurement target face, so that an accurate and reliable displacement measurement can be performed.

PRIOR ART DOCUMENT

Patent Document

Patent Document 1: JP 2001-004431 A

SUMMARY OF THE INVENTION

Problems to be Solved by the Invention

However, since the capacitive displacement sensor has a fixed capacitive sensor, the change in capacitance may be too small to measure the displacement of the displacement measurement target face, for example, when the sensitivity of the measurement target is low, or when the measurement target is located at a relatively long distance.

Therefore, it is an object of the present disclosure to provide a proximity sensor unit having a wide detection range, as compared with a proximity sensor unit whose proximity sensor section is fixed, and a distance calculation device including the proximity sensor unit.

Means for Solving the Problems

A proximity sensor unit as an example of the present disclosure includes:

a proximity sensor section having a sensor electrode capable of detecting a capacitance value according to a distance to an object to be detected in a detection direction; and a moving device capable of moving the sensor electrode of the proximity sensor section or the object to be detected in the detection direction.

A distance calculation device as an example of the present disclosure includes:

the proximity sensor unit;

a proximity sensor unit control unit that controls the proximity sensor section and the moving device;

a movement amount detection unit that detects an amount of movement when the proximity sensor section or the object to be detected is moved from a reference position to a movement position along the detection direction; and a distance calculation unit that calculates a distance between the proximity sensor unit and the object to be detected in the detection direction based on a first capacitance value which is the capacitance value detected at the reference position, a second capacitance value which is the capacitance value detected at the movement position, and the amount of movement.

Effects of the Invention

The proximity sensor unit includes the moving device capable of moving the sensor electrode of the proximity sensor section in a capacitive proximity sensor or the object to be detected in the detection direction. For example, even when the object to be detected is far away from the proximity sensor unit, and a change in the capacitance of the sensor electrode cannot be detected accurately, this moving device brings the proximity sensor section closer to the object to be detected along the detection direction, and the change in the capacitance of the sensor electrode can be detected accurately. As a result, a proximity sensor unit having a wider detection range can be realized as compared with a proximity sensor unit whose proximity sensor section is fixed.

According to the distance calculation device, since the proximity sensor unit can calculate accurately the distance between the proximity sensor section and the object to be detected, for example, even when the object to be detected is far away from the proximity sensor unit, it is possible to realize a distance calculation device with a wider detection range, compared with a proximity sensor unit whose proximity sensor section is fixed.

MODE FOR CARRYING OUT THE INVENTION

Hereinafter, an example of the present disclosure will be described with reference to the accompanying drawings.

Note that, in the following description, although terms indicating a specific direction or position (for example, terms including "up", "down", "right", "left") will be used as necessary, they are used for facilitating understanding of the present disclosure with reference to the drawings, and the technical scope of the present disclosure is not limited by the meaning of those terms. It should be noted that the following description is merely exemplary in nature and is not intended to limit the present disclosure, its application, or its use. Furthermore, the drawings are schematic, and the ratios of the dimensions do not always match actual ones.

Figure 1:
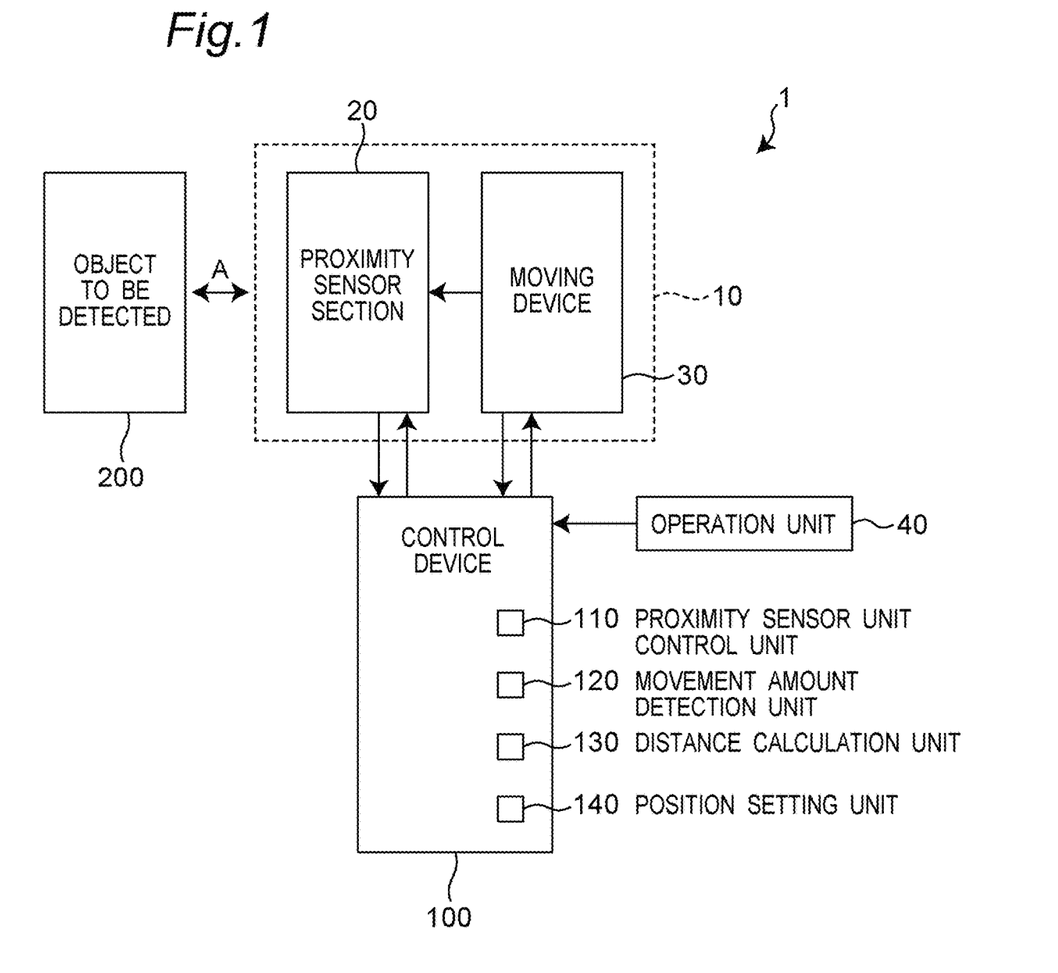
FIG. 1 is a block diagram showing a distance calculation device according to an embodiment of the present disclosure.

As shown in FIG. 1, a distance calculation device 1 according to an embodiment of the present disclosure includes, as an example, a proximity sensor unit 10, a control device 100 that controls the proximity sensor unit 10, and an operation unit 40 connected to the control device 100.

The proximity sensor unit 10 includes a proximity sensor section 20 capable of detecting a capacitance value C according to the distance to an object to be detected 200 in a detection direction (for example, a direction of arrow A in FIG. 1) and a moving device 30 that can move the proximity sensor section 20 in the detection direction A.

Figure 2:
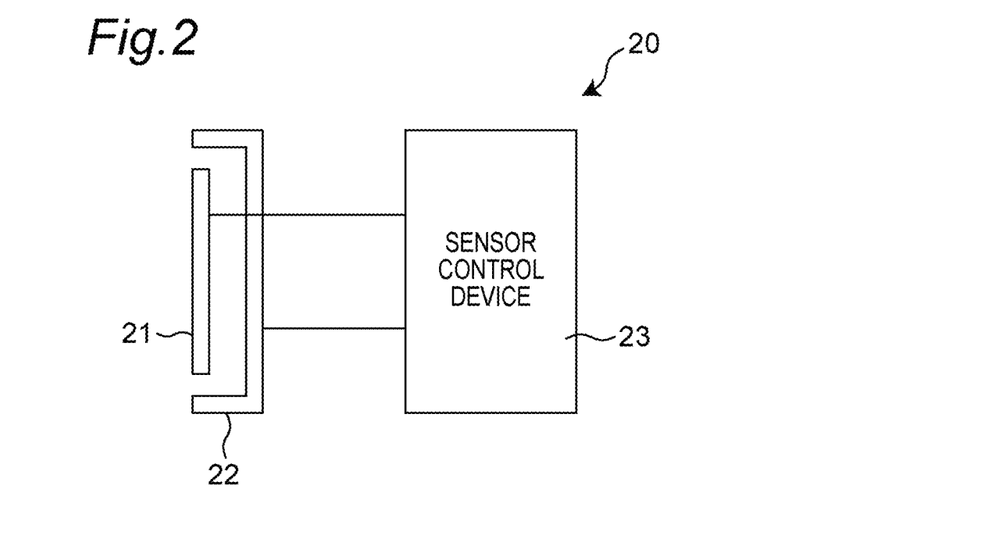
FIG. 2 is a schematic view of a proximity sensor section of the distance calculation device of FIG. 1.

The proximity sensor section 20 is a capacitive proximity sensor that has a circuit part of which is used as a conductor electrode, and converts the change in the capacitance of the conductor electrode caused by bringing another conductor or a dielectric close to the conductor electrode into an electrical signal to detect an approach and separation of an object. As an example, as shown in FIG. 2, the proximity sensor section 20 includes a sensor electrode 21, a shield electrode 22 disposed to face the sensor electrode 21, and a sensor control device 23 that controls the sensor electrode 21 and the shield electrode 22. The sensor control device 23 detects the capacitance of the sensor electrode 21 to output the capacitance to the control device 100, and supplies the shield electrode 22 with a voltage having the same potential as the sensor electrode 21.

The moving device 30 includes, for example, a motor (not shown) that moves the sensor electrode 21 in the detection direction A and an encoder (not shown) that detects the rotation of this motor, and is configured to output information detected by the encoder to the control device 100.

The moving device 30 may be configured to move the entire proximity sensor section 20 in the detection direction A, thereby moving the sensor electrode 21 in the detection direction A, or may be configured to move only the sensor electrode 21 (and the shield electrode 22) in the detection direction A instead of moving the entire proximity sensor section 20. When moving the entire proximity sensor section 20 in the detection direction A, the proximity sensor unit 10 can be configured by using, for example, a general-purpose capacitive proximity sensor and a general-purpose motor. That is, the proximity sensor unit 10 can be easily configured. The moving device 30 may be configured so that the sensor electrode 21 can be moved only in the detection direction A, or the sensor electrode 21 can be moved not only in the detection direction A but also in a direction intersecting the detection direction A.

The control device 100 includes a CPU that performs calculation, a storage medium such as a ROM and a RAM that store programs, data or the like necessary for controlling the proximity sensor unit 10, and an interface unit that inputs and outputs signals to and from the outside of the distance calculation device 1. As shown in FIG. 1, the control device 100 includes a proximity sensor unit control unit 110, a movement amount detection unit 120, a distance calculation unit 130, and a position setting unit 140. The proximity sensor unit control unit 110, the movement amount detection unit 120, the distance calculation unit 130, and the position setting unit 140 have functions realized by the CPU executing a predetermined program.

The proximity sensor unit control unit 110 controls a movement of the sensor electrode 21 in the detection direction A by outputting a command to the moving device 30 of the proximity sensor unit 10 based on the operation received by the operation unit 40. The proximity sensor unit control unit 110 controls the proximity sensor section 20 to detect a capacitance value C of the sensor electrode 21 at any position along the detection direction A.

Figure 3:
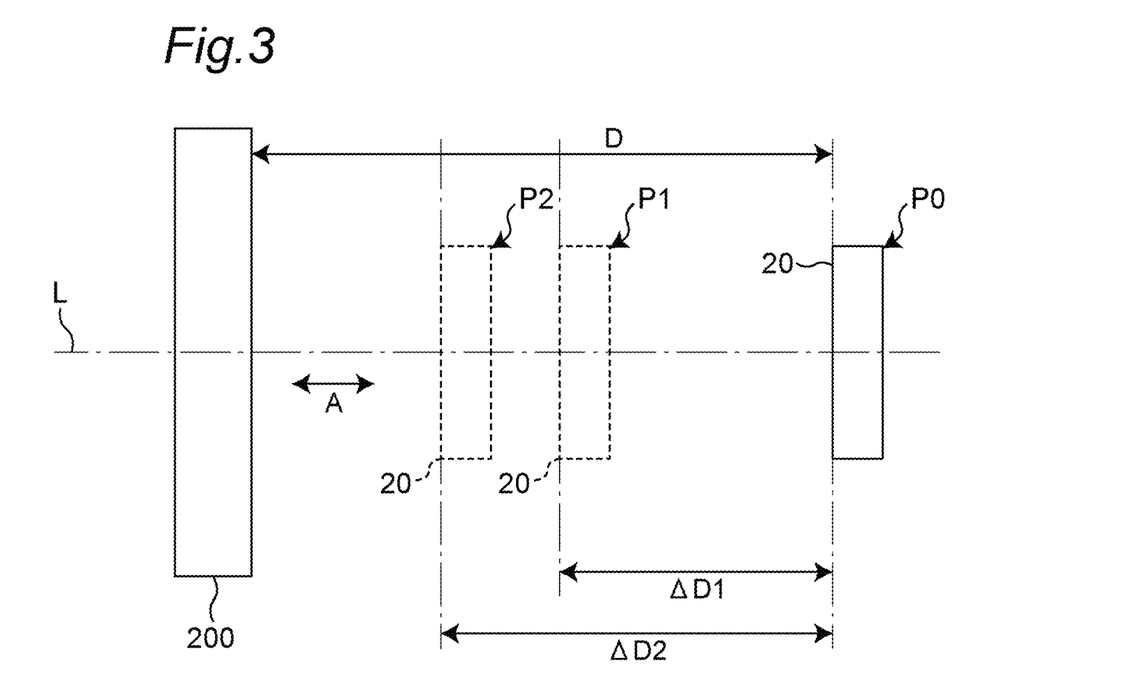
FIG. 3 is a diagram for explaining a distance calculation process of the distance calculation device of FIG. 1.

As shown in FIG. 3, the movement amount detection unit 120 detects a movement amount $\Delta D$ when the proximity sensor section 20 is moved from a reference position P0 to a movement position P along the detection direction A. Each of the reference position P0 and the movement position P is set by the position setting unit 140. The movement amount detection unit 120 calculates the movement amount $\Delta D$ based on the information detected by the encoder of the moving device 30, for example. In the embodiment, as an example, a position closer to the object to be detected 200 than the reference position P0 in the detection direction A is represented by a movement position P1, and a movement amount when the proximity sensor section 20 is moved from the reference position P0 to the movement position P1 is represented by a $\Delta D1$. The detection direction A is determined by an extending direction of a virtual straight line L connecting the object to be detected 200 and the proximity sensor section 20 when the proximity sensor section 20 is located at the reference position P0.

The distance calculation unit 130 calculates a distance D in the detection direction A between the proximity sensor section 20 of the proximity sensor unit 10 and the object to be detected 200 at the reference position P0 based on the capacitance value C of the sensor electrode 21 (hereinafter referred to as a reference capacitance value C0) detected at the reference position P0, the capacitance value C of the sensor electrode 21 detected at the movement position P (hereinafter referred to as a first capacitance value C1), by the proximity sensor section 20, and the movement amount $\Delta D$ detected by the movement amount detection unit 120. Specifically, the distance calculation unit 130 calculates the distance D from the change amount of the reference capacitance value C0 and the first capacitance value C1 and a first movement amount $\Delta D1$.

The distance calculation unit 130 determines whether the distance D can be calculated based on the capacitance values C0 and C1 detected at the respective positions P0 and P1. For example, the distance calculation unit 130 determines that the distance D can be calculated when a noise of the capacitance values C0 and C1 is equal to or less than a threshold value. For example, when the proximity sensor section 20 is configured by a self-capacitating proximity sensor, the distance calculation unit 130 determines that the distance D can be calculated when the first capacitance value C1 is larger than the reference capacitance value C0. When the proximity sensor section 20 is configured by a mutual capacitive proximity sensor, it determines that the distance D can be calculated when the reference capacitance value C0 is larger than the first capacitance value C1. For example, the distance calculation unit 130 determines that the distance D can be calculated when an absolute value of the difference between the reference capacitance value C0 and the first capacitance value C1 is equal to or greater than a threshold value. The noise of the capacitance values C0 and C1 is determined by, for example, a value three times the standard deviation or a peak-to-peak value. When a SN ratio required for the accuracy of a distance to be measured is known, the SN ratio may be set as a threshold value. A threshold value used for determining whether the distance D can be calculated is set in advance according to, for example, a performance of the proximity sensor section 20 or the application target of the distance calculation device 1.

When it is determined that the distance D cannot be calculated, the distance calculation unit 130 determines whether the number of times it is determined that the distance D cannot be calculated exceeds a predetermined number of times (for example, one). When the number of times it is determined that the distance D cannot be calculated when counted from the start of the distance calculation process does not exceed the predetermined number of times (for example, when the determination that the distance D cannot be calculated is made once), the distance calculation unit 130 determines again whether the distance D cannot be calculated based on the reference capacitance value C0 and the first capacitance value C1 redetected by the proximity sensor section 20 and the first movement amount ΔD1 redetected by the movement amount detection unit 120 after the determination that the distance D cannot be calculated is made once.

When the number of times it is determined that the distance D cannot be calculated exceeds the predetermined number (for example, when the determination that the distance D cannot be calculated is made twice or more), the distance calculation unit 130 determines again whether the distance D cannot be calculated based on the reference capacitance value C0 and a second capacitance value C2, which is the capacitance value C of a movement position P2, detected by the proximity sensor section 20 after most recently it is determined that the distance D cannot be calculated and the movement position is changed (for example, after the movement position P is changed from the movement position P1 to the movement position P2 shown in FIG. 3), and a second movement amount ΔD2 when the proximity sensor section 20 is moved from the reference position P0 to the second movement position P2. The movement position P2 is a position closer to the object to be detected 200 than the movement position P1 in the detection direction A.

The position setting unit 140 sets the reference position P0 and the movement position P based on, for example, the performance of the proximity sensor section 20 or the application target of the distance calculation device 1.

Next, the distance calculation process of the distance calculation device 1 will be described with reference to FIG. 4. It should be noted that these processes described below are performed by the control device 100 executing a predetermined program.

Figure 4:
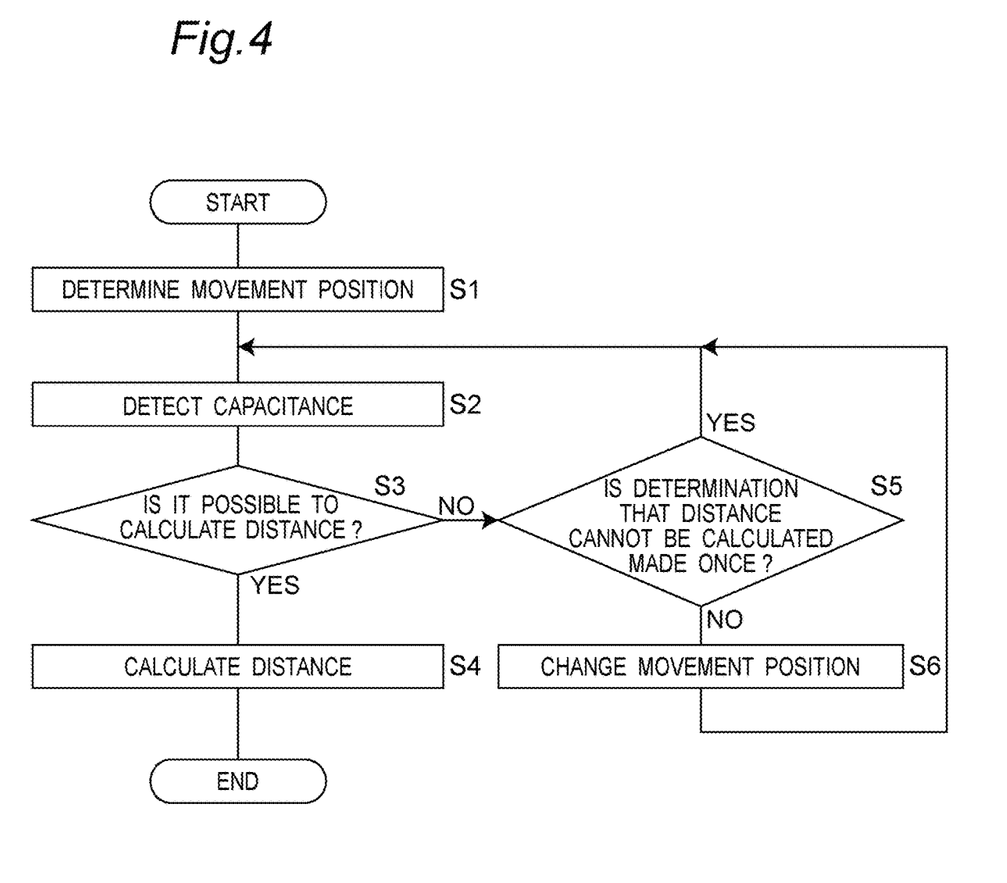
FIG. 4 is a flowchart for explaining the distance calculation process of the distance calculation device of FIG. 1.

As shown in FIG. 4, first, the position setting unit 140 sets the reference position P0 and the movement position P (step S1). Here, it is assumed that the first movement position P1 is set as the movement position P.

When the reference position P0 and the movement position P are set, the proximity sensor unit control unit 110 moves the proximity sensor section 20 to the reference position P0 to detect the reference capacitance value C0 of the sensor electrode 21 at the reference position P0, and thereafter moves the proximity sensor section 20 to the first movement position P1 to detect the first capacitance value C1 of the sensor electrode 21 at the movement position P1. Then, the movement amount detection unit 120 detects the first movement amount ΔD1 when the proximity sensor section 20 is moved from the reference position P0 to the first movement position P1 (step S2).

When the reference capacitance value C0 and the first capacitance value C1 are detected, the distance calculation unit 130 determines whether the distance D in the detection direction A between the proximity sensor unit 10 at the reference position P0 and the object to be detected 200 can be calculated (step S3). When it is determined that the distance D can be calculated, the distance calculation unit 130 calculates the distance D based on the capacitance values C0 and C1 detected in step S2 and the first movement amount ΔD1 (step S4), and ends the distance calculation process.

When it is determined that the distance D cannot be calculated, the distance calculation unit 130 determines whether the number of times it is determined that the distance D cannot be calculated is one when counted from the start of the distance calculation process (step S5). When it is determined that a determination that the distance D cannot be calculated is made once, the process returns to step S2, and each of the reference capacitance value C0, the first capacitance value C1, and the first movement amount ΔD1 is redetected, and in step S3 it is determined again whether the distance D can be calculated based on each of the redetected capacitance values C0 and C1, and the redetected first movement amount ΔD1.

When it is determined that a determination that the distance D cannot be calculated is made not once but twice or more, the position setting unit 140 changes the movement position P from the first movement position P1 to the second movement position P2 (step S6). Then, returning to step S2, the proximity sensor unit control unit 110 redetects the reference capacitance value C0, then moves the proximity sensor section 20 to the second movement position P2 to detect the second capacitance value C2 of the sensor electrode 21 at the second movement position P2. The movement amount detection unit 120 detects the second movement amount ΔD2 when the proximity sensor section 20 is moved from the reference position P0 to the second movement position P2. Then, in step S3, it is determined again whether the distance D can be calculated based on the redetected reference capacitance value C0, the newly detected second capacitance value C2, and the second movement amount ΔD2.

The proximity sensor unit 10 includes the moving device 30 capable of moving the sensor electrode 21 of the proximity sensor section 20 in the detection direction A. For example, even when the object to be detected 200 is far away from the proximity sensor unit 10, and a change in the capacitance value C of the sensor electrode 21 cannot be detected accurately, this moving device 30 brings the proximity sensor section 20 closer to the object to be detected 200 along the detection direction A, and the change in the capacitance value C of the sensor electrode 21 can be detected accurately. For example, even when the proximity sensor unit 10 is close to the object to be detected 200, and cannot be closer to the object to be detected 200, the moving device 30 moves the proximity sensor section 20 away from the object to be detected 200 along the detection direction A, and the change in the capacitance value C of the sensor electrode 21 can be detected. As a result, the proximity sensor unit 10 having a wide detection range can be realized.

According to the distance calculation device 1, even when, for example, the object to be detected 200 is far away from the proximity sensor unit 10, and the change in the capacitance value C of the sensor electrode 21 is too small, so that the proximity sensor unit 10 cannot accurately calculate the distance D between the proximity sensor section 20 and the object to be detected 200, the moving device 30 brings the proximity sensor section 20 closer to the object to be detected 200 along the detection direction A, so that the distance D between the proximity sensor section 20 and the object to be detected 200 can be calculated accurately. For example, even when the proximity sensor unit 10 is close to the object to be detected 200, and cannot be closer to the object to be detected 200, the moving device 30 moves the proximity sensor section 20 away from the object to be detected 200 along the detection direction A, so that the distance D between the proximity sensor section 20 and the object to be detected 200 can be calculated. As a result, the distance calculation device 1 having a wide detection range can be realized.

The distance calculation unit 130 determines whether the distance D between the proximity sensor section 20 and the object to be detected 200 can be calculated based on the capacitance value C detected at each of the reference position P0 and the movement position P. With such a configuration, the distance D between the proximity sensor section 20 and the object to be detected 200 can be detected more accurately.

When it is determined that the distance D cannot be calculated, the proximity sensor unit control unit 110 controls the moving device 30 to move the proximity sensor section 20 from the reference position P0 to the first movement position P1 along the detection direction A, and controls the proximity sensor section 20 to redetect the capacitance values C0 and C1 at the reference position P0 and the first movement position P, respectively. The movement amount detection unit 120 redetects the first movement amount ΔD1. The distance calculation unit 130 calculates again the distance D between the proximity sensor section 20 and the object to be detected 200 based on the redetected reference capacitance value C0, the redetected first capacitance value C1, and the redetected first movement amount ΔD1. With such a configuration, the distance D between the proximity sensor section 20 and the object to be detected 200 can be detected more accurately.

When it is determined that the distance D cannot be calculated, the proximity sensor unit control unit 110 controls the moving device 30 to move the proximity sensor section 20 along the detection direction A from the reference position P0 to the second movement position P2 different from the first movement position P1, and controls the proximity sensor section 20 to redetect the reference capacitance value C0 at the reference position P0 and detect the capacitance value C2 at the second movement position P2. The movement amount detection unit 120 detects the second movement amount ΔD2 when the proximity sensor section 20 is moved from the reference position P0 to the second movement position P2 along the detection direction A. The distance calculation unit 130 calculates again the distance D between the proximity sensor section 20 and the object to be detected 200 based on the reference capacitance value C0 redetected at the reference position P0, the second capacitance value C2, and the second movement amount ΔD2. With such a configuration, the distance D between the proximity sensor section 20 and the object to be detected 200 can be detected more accurately.

After the distance D based on the reference capacitance value C0, the first capacitance value C1, and the first movement amount ΔD1 is recalculated at least once, the distance calculation unit 130 recalculates the distance D based on the reference capacitance value C0, the second capacitance value C2 and the second movement amount ΔD2. With such a configuration, the distance D between the proximity sensor section 20 and the object to be detected 200 can be detected more accurately.

In the above embodiment, the distance calculation unit 130 calculates the distance D based on the reference position P0 and one movement position P1 (or P2), but the way of calculating the distance D is not limited to this. The distance calculation unit 130 may be configured to calculate the distance D using the reference position P0 and two or more movement positions P (for example, the first movement position P1 and the second movement position P2). With such a configuration, the distance D between the proximity sensor section 20 and the object to be detected 200 can be detected more accurately.

Figure 5:
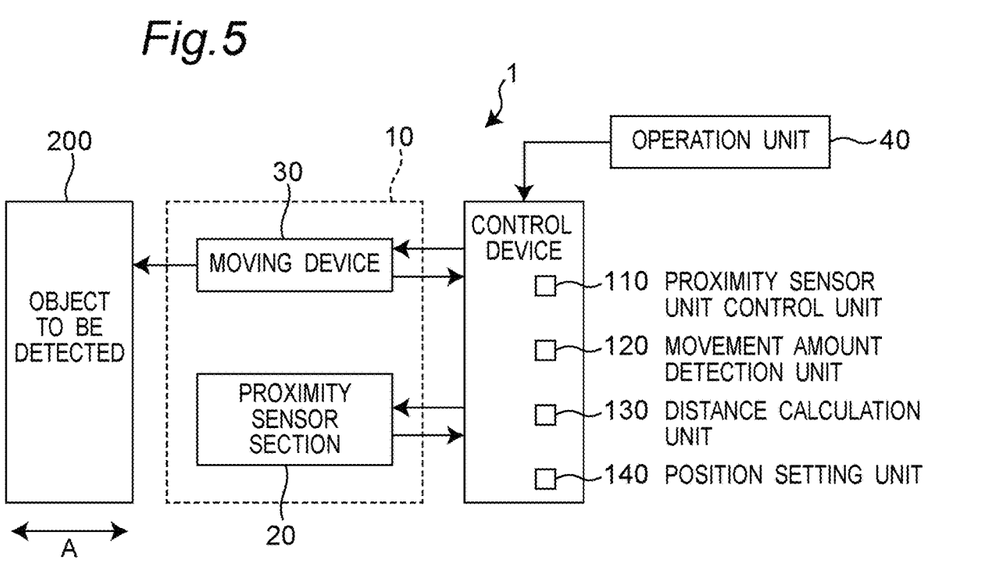
FIG. 5 is a block diagram showing a first modification of the distance calculation device of FIG. 1.

In the above embodiment, the moving device 30 is configured to be able to move the proximity sensor section 20, but the way of moving the configuration is not limited to this. As shown in FIG. 5, the moving device 30 may be configured to move the object to be detected 200.

In the distance calculation process shown in FIG. 4, steps S3, S5, and S6 may be omitted. That is, the determination of whether the distance D between the proximity sensor section 20 at the reference position P0 and the object to be detected 200 can be calculated may be omitted.

When it is determined in step S3 that the distance D cannot be calculated, the movement position P may be changed from the first movement position P1 to the second movement position P2 regardless of the number of times of the determination that the distance D cannot be calculated.

A calibration process may be performed before the reference capacitance value C0, the first capacitance value C1, and the first movement amount ΔD1 are detected in step S2. By performing the calibration process, it is possible to cancel the parasitic capacitance and roughly correct the temperature characteristics and humidity characteristics.

Before calculating the distance in step S4, data preprocessing including average value acquisition or filtering may be performed.

Figure 6:
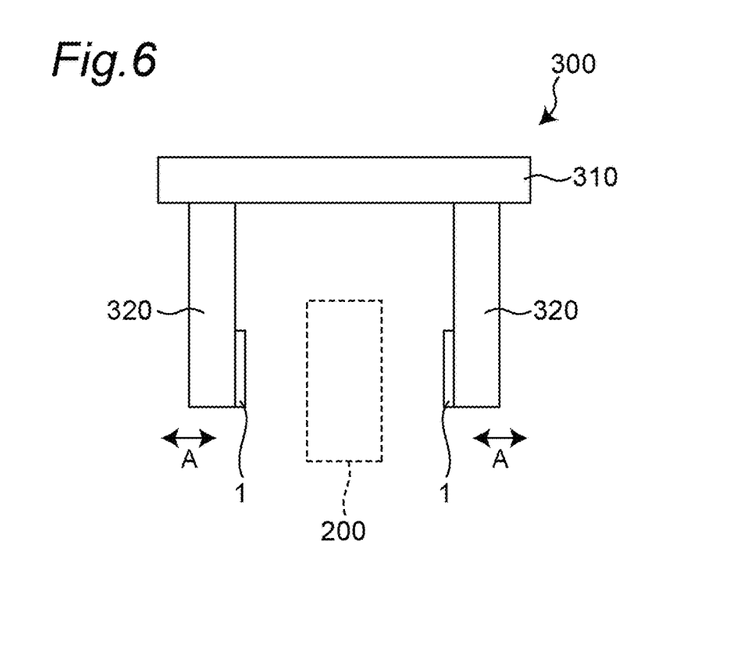
FIG. 6 is a block diagram showing a second modification of the distance calculation device of FIG. 1.

The distance calculation device 1 of the above embodiment may be applied to, for example, an end effector 300 as shown in FIG. 6. As an example, the end effector 300 of FIG. 6 includes a palm portion 310 and two finger portions 320 connected to the palm portion 310. The distance calculation device 1 is provided at the distal end of each finger portion 320 and on facing surfaces facing each other. Each finger portion 320 is configured to be movable in the arrow A direction (that is, the detection direction) by a drive device (not shown). That is, in the end effector 300, the drive device that drives each finger portion 320 also serves as the moving device 30 that can move the proximity sensor section 20 in the detection direction A.

Figure 7:
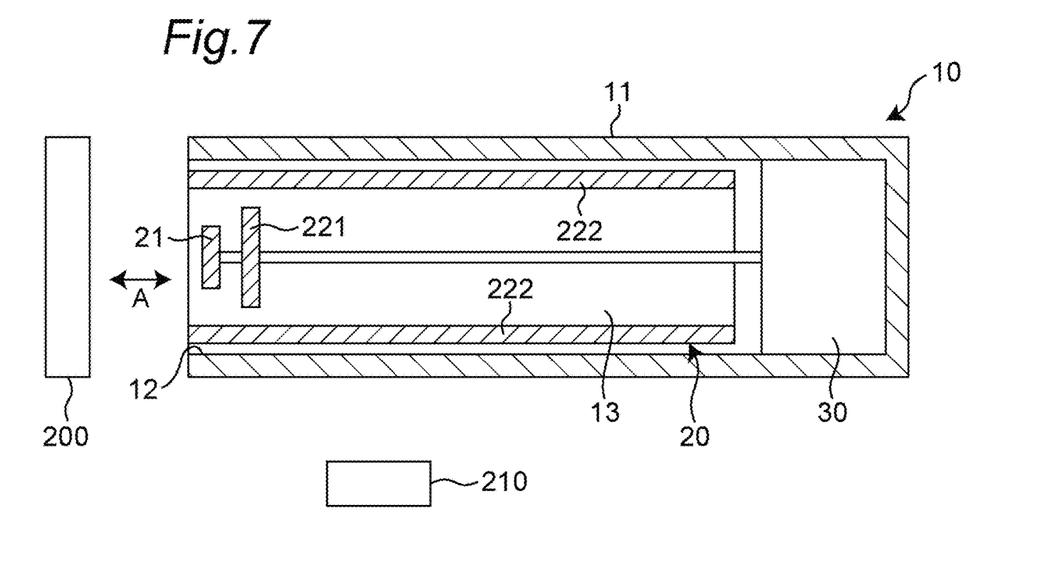
FIG. 7 is a schematic cross-sectional view showing a modification of a proximity sensor unit of the distance calculation device of FIG. 1.

For example, as shown in FIG. 7, the proximity sensor unit 10 may include a tubular housing 11 in which the proximity sensor section 20 and the moving device 30 are housed. The housing 11 has an opening 12 in which the sensor electrode 21 is exposed to an outside and a passage portion 13 connected to the opening 12, the passage portion extending in the detection direction A so that the sensor electrode 21 can move. The passage portion 13 constitutes a part of the housing 2 and forms a passage through which the sensor electrode 21 can move. In this proximity sensor unit 10, the proximity sensor section 20 includes a first shield electrode 221 disposed farther from the opening 12 than the sensor electrode 21 in the detection direction A, and a second shield electrode 222 disposed so as to surround the sensor electrode 21 along the passage portion 13. The sensor electrode 21 and the first shield electrode 221 are connected to the moving device 30 and are configured to be movable in the detection direction A. With this configuration, it is possible to suppress the formation of an electric field between the sensor electrode 21 and an object 210 in the surrounding environment, so that the distance D between the proximity sensor section 20 and the object to be detected 200 can be detected more accurately.

Figure 8:
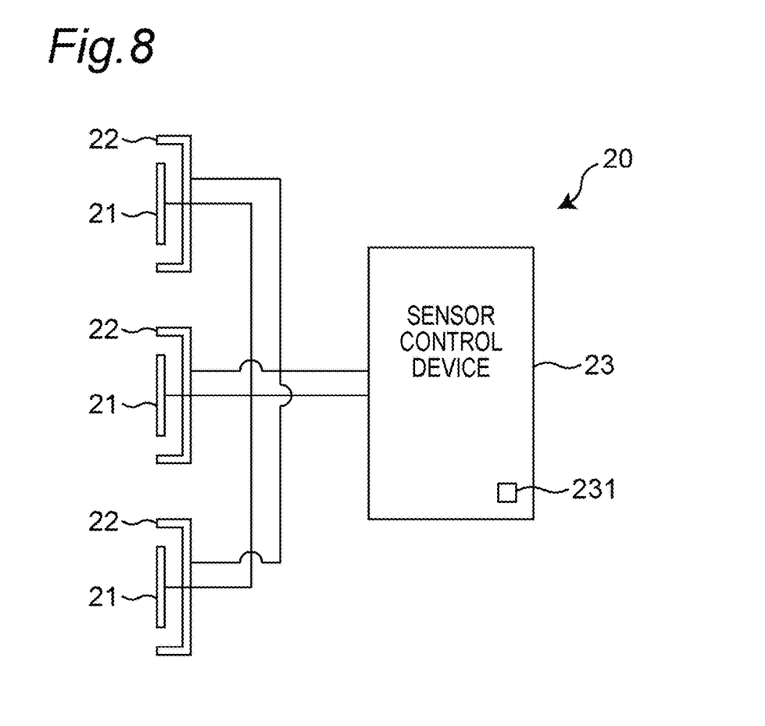
FIG. 8 is a schematic unit showing a modification of the proximity sensor section of the distance calculation device of FIG. 1.

For example, as shown in FIG. 8, the proximity sensor section 20 may be configured to include a plurality of the sensor electrodes 21 and an inclination correction unit 231 that corrects the deviation of inclination of the proximity sensor section 20 with respect to the object to be detected 200 from the capacitance values C detected by the plurality of sensor electrodes 21. It is possible to dispose the sensor electrode 21 parallel to the object to be detected 200 by the inclination correction unit 231 that corrects the deviation of inclination of the proximity sensor section 20 with respect to the object to be detected 200. As a result, an error of the capacitance value C detected by the sensor electrode 21 can be reduced, and the distance D between the proximity sensor section 20 and the object to be detected 200 can be detected more accurately. The inclination correction unit 231 has a function realized by, for example, the CPU of the sensor control device 23 implementing a predetermined program.

The deviation of inclination of the proximity sensor section 20 with respect to the object to be detected 200 is determined by, for example, comparing the capacitance values C detected by the plurality of sensor electrodes 21. The inclination correction unit 231 determines that there is no deviation of inclination when the detected capacitance values C match, and determines that there is a deviation of inclination when the detected capacitance values C do not match. When it is determined that there is a deviation of inclination, the inclination correction unit 231 outputs information on the deviation of inclination to the control device 100. The control device 100 controls the moving device 30 based on the information output from the inclination correction unit 231 to move the proximity sensor section 20 or the object to be detected 200 so that each sensor electrode 21 is parallel to the object to be detected 200.

As described above, various embodiments of the present disclosure have been described in detail with reference to the drawings, and finally, various aspects of the present disclosure will be described. It is to be noted that in the following description, description will be provided with reference numerals attached thereto as an example.

A proximity sensor unit 10 of a first aspect of the present disclosure includes:

a proximity sensor section 20 including a sensor electrode 21 capable of detecting a capacitance value C according to a distance to an object to be detected 200 in a detection direction A; and a moving device 30 capable of moving the sensor electrode 21 of the proximity sensor section 20 or the object to be detected 200 in the detection direction A.

According to the proximity sensor unit 10 of the first aspect, for example, even when the object to be detected 200 is far away from the proximity sensor unit 10, and a change in the capacitance value C of the sensor electrode 21 cannot be detected accurately, this moving device 30 brings the proximity sensor section 20 closer to the object to be detected 200 along the detection direction A, and the change in the capacitance value C of the sensor electrode 21 can be detected accurately. As a result, a proximity sensor unit having a wider detection range can be realized as compared with a proximity sensor unit whose proximity sensor section 20 is fixed.

The proximity sensor unit 10 of a second aspect of the present disclosure further includes a tubular housing 11 in which the proximity sensor section 20 and the moving device 30 capable of moving the sensor electrode 21 are housed, the tubular housing 11 including an opening 12 in which the sensor electrode 21 is exposed to an outside and a passage portion 13 in which the sensor electrode 21 is movable, the passage portion 13 being connected to the opening 12 and extending in the detection direction A, wherein the proximity sensor section 20 includes a shield electrode 222 disposed along the passage portion 13.

According to the proximity sensor unit 10 of the second aspect, it is possible to suppress a formation of an electric field between the sensor electrode 21 and the object 210 in the surrounding environment, so that the distance D between the proximity sensor section 20 and the object to be detected 200 can be detected more accurately.

In the proximity sensor unit 10 of a third aspect of the present disclosure, the proximity sensor section 20 includes a plurality of the sensor electrodes 21, and an inclination correction unit 231 that corrects a deviation of inclination of the proximity sensor section 20 with respect to the object to be detected 200 from the capacitance values C detected by the plurality of sensor electrodes 21.

According to the proximity sensor unit 10 of the third aspect, it is possible to dispose the sensor electrode 21 parallel to the object to be detected 200 by the inclination correction unit 231 that corrects the deviation of inclination of the proximity sensor section 20 with respect to the object to be detected 200. As a result, an error of the capacitance value C detected by the sensor electrode 21 can be reduced, and the distance D between the proximity sensor section 20 and the object to be detected 200 can be detected more accurately.

A distance calculation device 1 of a fourth aspect of the present disclosure includes:

the proximity sensor unit 10 of the above aspect;

a proximity sensor unit control unit 110 that controls the proximity sensor section 20 and the moving device 30;

a movement amount detection unit 120 that detects a first movement amount $\Delta D1$ when the proximity sensor section 20 or the object to be detected 200 is moved from a reference position P0 to a first movement position P1 along the detection direction A; and a distance calculation unit 130 that calculates a distance D in the detection direction A between the proximity sensor unit 10 and the object to be detected 200 at the reference position P0 based on a reference capacitance value C0, which is the capacitance value C detected at the reference position P0, and a first capacitance value C1, which is the capacitance value C detected at the first movement position P1, and the first movement amount $\Delta D1$.

According to the distance calculation device 1 of the fourth aspect, since the proximity sensor unit 10 can calculate accurately the distance D between the proximity sensor section 20 and the object to be detected 200, for example, even when the object to be detected 200 initially set is far away from the proximity sensor unit 10, it is possible to realize the distance calculation device 1 with a wider detection range, compared with a proximity sensor unit whose proximity sensor section 20 is fixed.

In the distance calculation device 1 of a fifth aspect of the present disclosure, the distance calculation unit 130 determines whether the distance D can be calculated based on the capacitance values C0 and C1 detected at the reference position P0 and the movement position P1, respectively.

According to the distance calculation device 1 of the fifth aspect, the distance D between the proximity sensor section 20 and the object to be detected 200 can be detected more accurately.

In the distance calculation device 1 of a sixth aspect of the present disclosure, when it is determined that the distance D cannot be calculated, the proximity sensor unit control unit 110 controls the moving device 30 to move again the proximity sensor section 20 or the object to be detected 200 from the reference position P0 to the first movement position P1 and controls the proximity sensor section 20 to redetect the capacitance values C0 and C1 at the reference position P0 and the first movement position P1, respectively, the movement amount detection unit 120 redetects the first movement amount ΔD1 when the object to be detected 200 is moved again from the reference position P0 to the first movement position P1, and the distance calculation unit 130 calculates again the distance D based on the reference capacitance value C0 redetected at the reference position P0, the first capacitance value C1 redetected at the first movement position ΔD1, and the redetected first movement amount ΔD1.

According to the distance calculation device 1 of the sixth aspect, the distance D between the proximity sensor section 20 and the object to be detected 200 can be detected more accurately.

In the distance calculation device 1 of a seventh aspect of the present disclosure, when it is determined that the distance D cannot be calculated, the proximity sensor unit control unit 110 controls the moving device 30 to move the proximity sensor section 20 or the object to be detected 200 from the reference position P0 to a second movement position P1 along the detection direction A, and controls the proximity sensor section 20 to redetect the reference capacitance value C0 at the reference position P0 and to detect a second capacitance value C2 at the second movement position P2, the movement amount detection unit 120 detects a second movement amount ΔD2 when the proximity sensor section 20 or the object to be detected 200 is moved from the reference position P0 to the second movement position P2 along the detection direction A, and the distance calculation unit 130 calculates again the distance D based on the reference capacitance value C0 redetected at the reference position P0, the second capacitance value C2, and the second movement amount ΔD2.

According to the distance calculation device 1 of the seventh aspect, the distance D between the proximity sensor section 20 and the object to be detected 200 can be detected more accurately.

In the distance calculation device 1 of an eighth aspect of the present disclosure, the distance calculation unit recalculates the distance based on the reference capacitance value, the second capacitance value, and the second movement amount after the distance is recalculated based on the reference capacitance value, the first capacitance value, and the first movement amount at least once.

According to the distance calculation device 1 of the eighth aspect, the distance D between the proximity sensor section 20 and the object to be detected 200 can be detected more accurately.

Note that, by appropriately combining any of the above described various embodiments or modifications, it is possible to achieve the effects of the respective embodiments or modifications. In addition, a combination of the embodiments or a combination of the examples or a combination of the embodiment and the example is possible, and a combination of the features in the different embodiments or the examples is possible.

Although the present disclosure has been fully described in connection with preferred embodiments with reference to the accompanying drawings, various variations and modifications will be apparent to those skilled in the art. It is to be understood that such variations and modifications are included in the appended claims unless the variations and modifications depart from the scope of the present disclosure as set forth in the claims.

INDUSTRIAL APPLICABILITY

The proximity sensor unit of the present disclosure can be applied to, for example, a distance calculation device.

The distance calculation device of the present disclosure can be applied to, for example, an end effector.

REFERENCE SIGNS LIST 1 distance calculation device
10 proximity sensor unit
11 housing
12 opening
13 passage portion
20 proximity sensor section
21 sensor electrode
22 shield electrode
221 first shield electrode
222 second shield electrode
23 sensor control device
30 moving device
40 operation unit
100 control device
110 proximity sensor unit control unit
120 movement amount detection unit
130 distance calculation unit
140 position setting unit
200 object to be detected
210 object in the surrounding environment
300 end effector
A detection direction
C capacitance value
D distance
P position

The invention claimed is:

1. A proximity sensor unit comprising:
a proximity sensor section including a sensor electrode capable of detecting a capacitance value according to a distance to an object detected in a detection direction;
a moving device capable of moving the sensor electrode of the proximity sensor section or the object detected in the detection direction; and
a tubular housing in which the proximity sensor section and the moving device capable of moving the sensor electrode are housed, the tubular housing including an opening in which the sensor electrode is exposed to an outside and a passage portion in which the sensor electrode is movable, the passage portion being connected to the opening and extending in the detection direction, wherein the proximity sensor section includes a shield electrode which is disposed along the passage portion to surround the sensor electrode in a state that the shield electrode is non-movable in the detection direction in the passage portion.

2. The proximity sensor unit according to claim 1, wherein
the proximity sensor section includes
a plurality of the sensor electrodes, and
an inclination correction unit that corrects a deviation of inclination of the proximity sensor section with respect to the object detected from the capacitance values detected by the plurality of sensor electrodes.

3. A distance calculation device comprising:
the proximity sensor unit according to claim 1;
a proximity sensor unit control unit that controls the proximity sensor section and the moving device;
a movement amount detection unit that detects a first movement amount when the proximity sensor section or the object detected is moved from a reference position to a first movement position along the detection direction; and
a distance calculation unit that calculates a distance in the detection direction between the proximity sensor unit and the object detected at the reference position, based on a reference capacitance value, which is the capacitance value detected at the reference position, and a first capacitance value, which is the capacitance value detected at the first movement position, and the first movement amount.

4. The distance calculation device according to claim 3, wherein
the distance calculation unit determines whether the distance is calculatable based on the capacitance values detected at the reference position and the movement position, respectively.

5. The distance calculation device according to claim 4, wherein
when it is determined that the distance D is non-calculatable,
the proximity sensor unit control unit controls the moving device to move again the proximity sensor section or the object detected from the reference position to the first movement position and controls the proximity sensor section to redetect the capacitance values at the reference position and the first movement position, respectively,
the movement amount detection unit redetects the first movement amount when the object detected is moved again from the reference position to the first movement position, and
the distance calculation unit calculates again the distance based on the reference capacitance value redetected at the reference position, the first capacitance value redetected at the first movement position, and the redetected first movement amount.

6. The distance calculation device according to claim 5, wherein
when it is determined that the distance D is non-calculatable,
the proximity sensor unit control unit controls the moving device to move the proximity sensor section or the object detected from the reference position to a second movement position along the detection direction, and controls the proximity sensor section to redetect the reference capacitance value at the reference position and to detect a second capacitance value at the second movement position,
the movement amount detection unit detects a second movement amount when the proximity sensor section or the object detected is moved from the reference position to the second movement position along the detection direction, and
the distance calculation unit calculates again the distance based on the reference capacitance value redetected at the reference position, the second capacitance value, and the second movement amount.

7. The distance calculation device according to claim 6, wherein
the distance calculation unit recalculates the distance based on the reference capacitance value, the second capacitance value, and the second movement amount after the distance is recalculated based on the reference capacitance value, the first capacitance value, and the first movement amount at least once.

8. The distance calculation device according to claim 4, wherein
when it is determined that the distance D is non-calculated,
the proximity sensor unit control unit controls the moving device to move the proximity sensor section or the object detected from the reference position to a second movement position along the detection direction, and controls the proximity sensor section to redetect the reference capacitance value at the reference position and to detect a second capacitance value at the second movement position,
the movement amount detection unit detects a second movement amount when the proximity sensor section or the object detected is moved from the reference position to the second movement position along the detection direction, and
the distance calculation unit calculates again the distance based on the reference capacitance value redetected at the reference position, the second capacitance value, and the second movement amount.

9. The distance calculation device according to claim 8, wherein
the distance calculation unit recalculates the distance based on the reference capacitance value, the second capacitance value, and the second movement amount after the distance is recalculated based on the reference capacitance value, the first capacitance value, and the first movement amount at least once.

10. The distance calculation device according to claim 1, wherein the moving device is capable of moving the sensor electrode of the proximity sensor section.

* * * * *